United States Patent [19]

Kuhnel

[11] 4,276,615

[45] Jun. 30, 1981

[54] ANALOG READ-ONLY MEMORY SYSTEM FOR ANTILOG CONVERSION

[75] Inventor: Donald S. Kuhnel, Houston, Tex.

[73] Assignee: Graphic Arts Manufacturing Company, Houston, Tex.

[21] Appl. No.: 79,888

[22] Filed: Sep. 28, 1979

[51] Int. Cl.$^3$ .......... G11C 13/00

[52] U.S. Cl. .......... 365/45; 320/1

[58] Field of Search .......... 365/45, 46; 320/1; 340/347 A–347 D

[56] References Cited

U.S. PATENT DOCUMENTS 2,787,418 4/1957 MacKnight .......... 365/244

*Primary Examiner*—Terrell W. Fears

*Attorney, Agent, or Firm*—Bard & Groves

[57] ABSTRACT

An analog read-only memory system is provided for converting an input signal to an output signal functionally related to the antilog of the input signal. A resistor-capacitor network conveniently provides an analog memory circuit, converting a linear time base to an output voltage antilogarithmically related to the charging time. Solid state switching devices are actuated in response to control signals to initiate a memory sweep, or capacitor charging cycle, after a time interval determined by the input signal to form the desired antilog conversion; and transferring the output signal to a holding circuit until a subsequent output is provided. The memory sweep is periodically repeated to maintain an output in antilogarithmic relationship with the input.

11 Claims, 4 Drawing Figures

ANALOG READ-ONLY MEMORY SYSTEM FOR ANTILOG CONVERSION

BACKGROUND OF THE INVENTION

This invention relates to analog conversion circuits and, more particularly, to an analog circuit functioning as a read-only memory for converting an analog or digital input to an output which is functionally related to the antilog of the input.

Instrumentation and control equipment uses a variety of circuitry for producing output wave forms having various characteristics. For example, square waves, triangular waves, and sinusoidal waves are common wave forms generated by function generators. These wave forms may be obtained from either digital or analog-type systems.

Yet another function which may typically be used is a logarithmic or, conversely, an anti-logarithmic wave form. Such circuits might be used to obtain a logarithmic relationship between an input and an output. One use for such a circuit would be to obtain an improved zero point resolution with respect to a scale having an output over several orders of magnitude. Still other uses would be equivalent to an analog read only memory for directly converting an input to its antilogarithmic equivalent.

Logarithmic and anti-logarithmic conversion circuits exist in the prior art. Digital circuits typically use a read-only memory for converting an input to its logarithm or anti-logarithm. Analog circuits are also available. In one conversion scheme, the forward conduction characteristics of a diode generally approximate an exponential relationship between input voltage and current. Thus, a logarithmic relationship may be obtained between the input and output by converting the output current to a voltage for processing over the appropriate forward conduction range of the diode. In yet another embodiment, diodes are used as shunting devices to approximate a logarithmic output by a stepped removal of resistors to produce an output logarithmically related to the input.

Prior art devices having a high degree of accuracy and resolution are, however, expensive. Further, digital techniques, while accurate, require analog-to-digital conversion circuits at the input and digital-to-analog conversion circuits at the output for use in an analog control scheme. Circuits using diode forward conduction characteristics may be relatively simple but are relatively inaccurate due to the temperature sensitivity of the characteristics. Temperature compensating components may be used, but only at increased complexity and cost. Diode shunting circuitry forms only an approximate waveform and a large number of resistors and diodes are required to obtain an accurate resolution, particularly about the zero point. These and other disadvantages of the prior art are overcome by the present invention, however, and improved methods and apparatus are provided for obtaining a logarithmic relationship between an input signal and a corresponding output signal.

SUMMARY OF THE INVENTION

In a preferred embodiment of the present invention, an analog read-only memory is provided which may take the form of a resistor-capacitor (RC) circuit to generate a desired output voltage, where the output is exponentially related to the time the capacitor has been charging. The voltage across the capacitor is directly proportional to the antilog of the charging time. Thus, a control system is provided to produce timing signals functionally related to an input signal whose antilog is to be obtained. The output from the analog memory, which may be a charging capacitor, is sampled at the appropriate time and the selected voltage is made available for display or as a control voltage.

A preferred embodiment of the present invention uses solid state switching devices, such as field effect transistors (FET) or metal-oxide-semiconductor (MOS) transistors, to receive control signals. The switches control capacitor charging, output voltage sampling, and capacitor discharging. Thus, at a first selected time, a first switch initiates capacitor charging; at a second selected time the capacitor voltage obtains the desired relationship to the input and a second switch transfers the voltage to a holding circuit; finally, at a third selected time, a third switch discharges the capacitor in preparation for another cycle.

In one embodiment, the control signal is obtained by comparing a linear ramp output voltage signal with a variable input voltage. When the ramp voltage exceeds the input voltage, a signal is generated which operates the appropriate switch to stop the capacitor charging and to sample and hold the voltage then appearing across the capacitor.

In another embodiment, a digital input is provided. A counting circuit then clocks down the input until a "zero" output is obtained to produce a control signal which terminates the capacitor charging and samples the output voltage. Thus, either an analog or a digital input may be used to directly produce an output signal representing the analog of the input.

It is a feature of the invention to provide an analog read-only memory for an antilog conversion system.

It is yet another feature of the present invention to provide an analog output in antilogarithmic relationship to either an analog or digital input.

Another feature is to convert a selected input to a linear time-related signal which sets a capacitor charging time to obtain the desired characteristics.

It is a feature of the present invention to provide an analog read-only memory system for obtaining an antilog relationship between an input signal and an output signal, comprising analog means for providing an exponential-type memory signal varying as a function of time from a preselected initial voltage toward a preselected reference voltage, first switch means for initializing said analog means at said initial voltage, second switch means for initiating said memory signal varying toward said reference voltage at a first time and for selecting said output from said memory signal at a second time; and control means for generating a plurality of control signals, including signals for activating said second switch means at said first and second times, respectively, the difference between said first and second times being linearly related to said input signal.

It is also a feature of the present invention to provide a method for generating an analog output signal functionally related to the antilog of an input signal, comprising deriving first and second control signals at a first time and a second time, respectively, the difference therebetween being linearly related to said input signal, switching on an analog read-only memory with said first signal to generate an exponentially increasing output signal beginning at a preselected reference voltage, switching off said analog read only memory with said second signal to obtain said exponentially increasing output signal functionally related to said antilog of said input signal.

These and other features and advantages of the present invention will become apparent from the following detailed description, wherein reference is made to the figures in the accompanying drawings.

IN THE DRAWINGS

Figure 4:
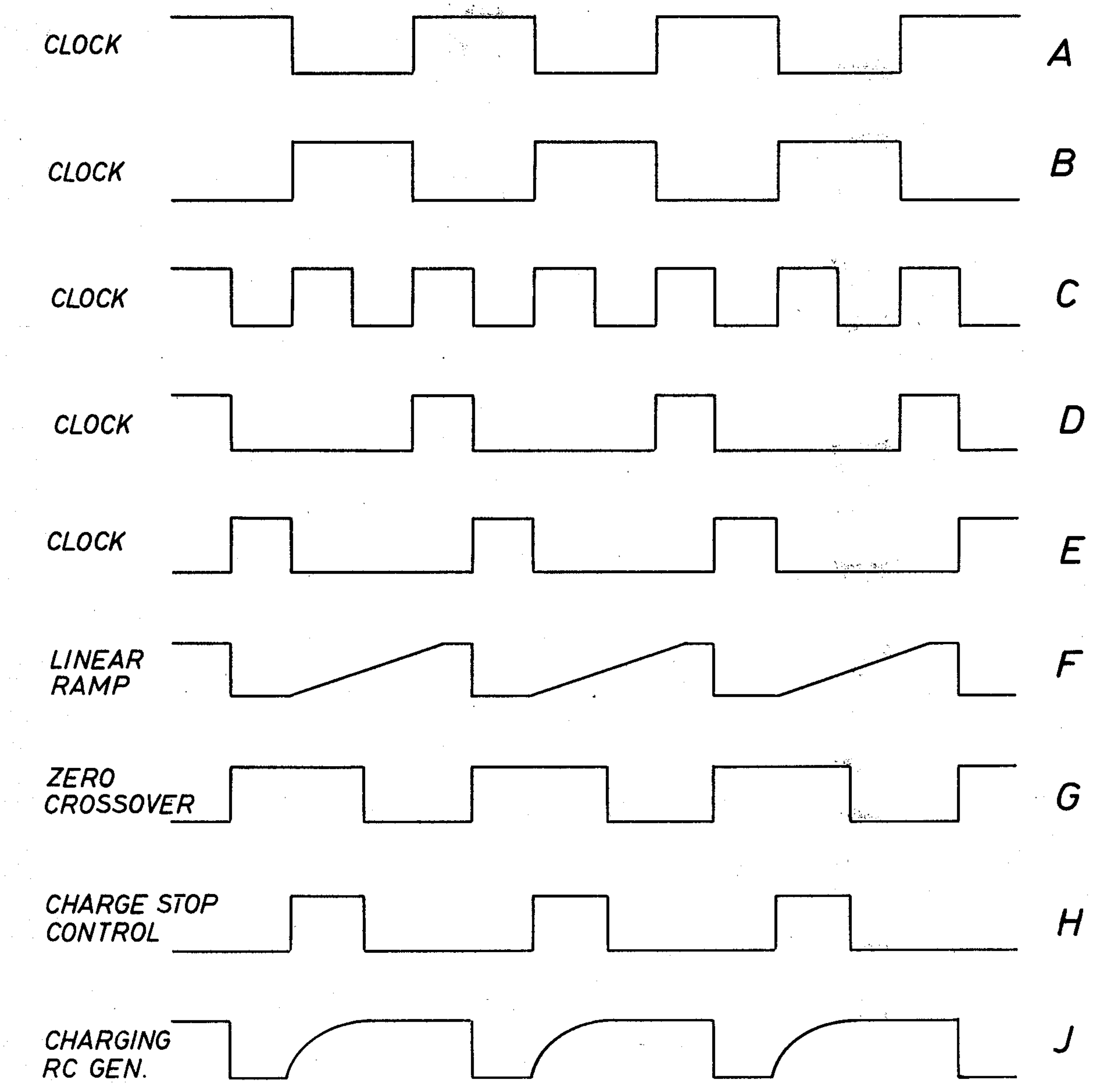
Figure 2:
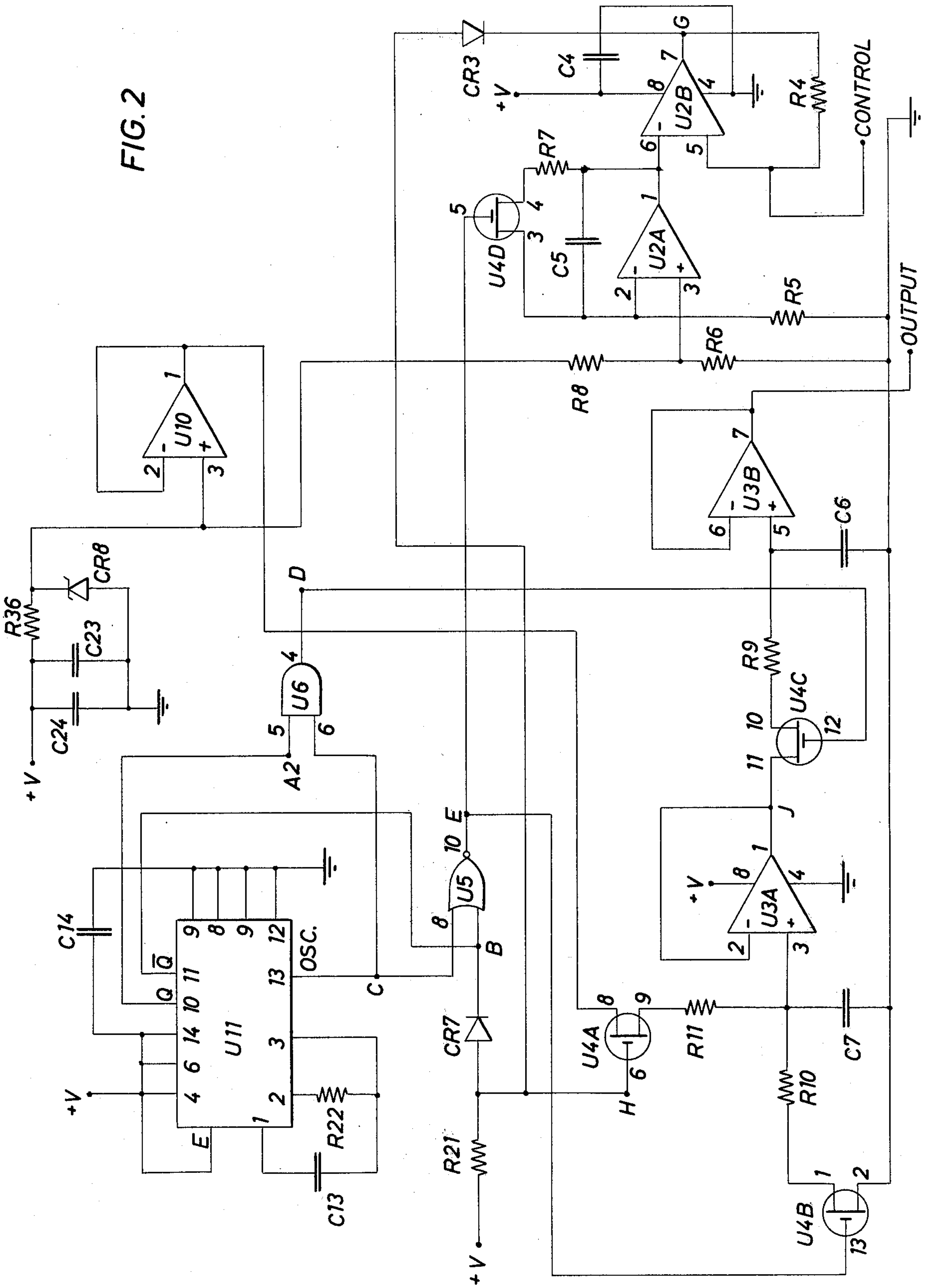
FIG. 2 is a detailed circuit schematic using an analog input.

FIG. 4, including A–J, is a timing diagram for FIG. 2.

DETAILED DESCRIPTION

Figure 1:
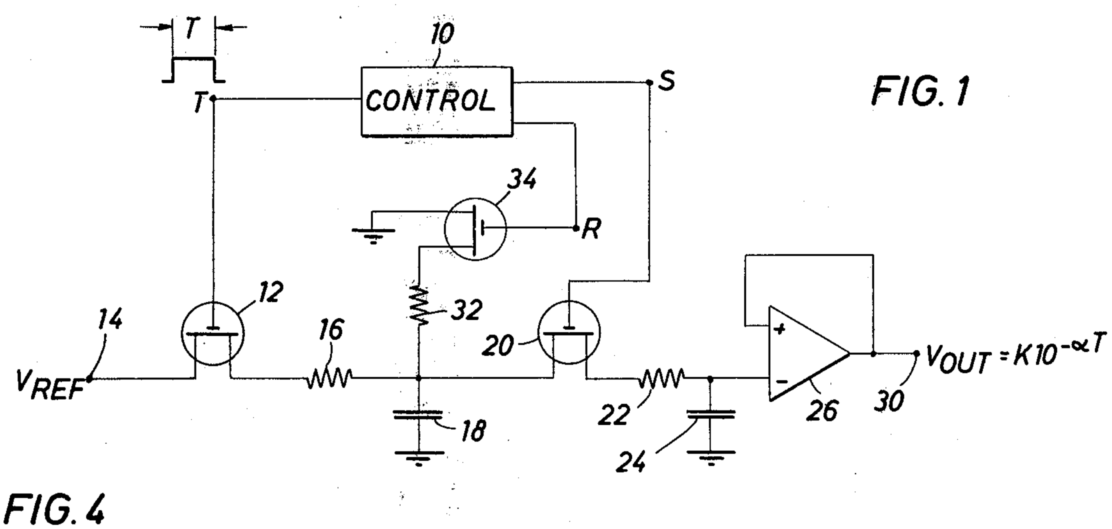
FIG. 1 is a simplified schematic of an antilog conversion circuit according to a preferred embodiment of the present invention.

Referring now to FIG. 1, there is depicted a functional schematic of apparatus according to the present invention. Control unit 10 provides an output control signal T where the duration "T" is determined by the input variable whose antilog is to be derived. Control signal T closes transistor switch 12 to apply reference voltage 14 to resistor 16 and capacitor 18. Capacitor 18 begins charging toward the reference voltage in an exponential manner with a time constant determined by the product of resistor 16 and capacitor 18.

At the end of control interval "T", transistor switch 12 opens, leaving capacitor 18 with an output voltage exponentially related to the duration of the charging time. The voltage across capacitor 18 is, accordingly, related to the antilog of the input from which charging signal T was derived. Thus, capacitor 18 and resistor 16 operate as an analog read-only memory where a complete memory read-out is obtained during each capacitor charging cycle.

A memory output is obtained by terminating the memory sweep after a selected time interval. Thus, control system 10 initiates sample signal S to close transistor switch 20 and transfer at least a portion of the charge on capacitor 18 through resistor 22 to capacitor 24. When sample signal S thereafter opens switch 20, the desired memory output voltage now appears across capacitor 24. This voltage is applied to operational amplifier 26 to prevent loading capacitor 24 and the desired output signal 30 is obtained. Thus, output signal 30 is in the desired relationship with the signal "T" to be converted.

Once the signal has been transferred from capacitor 18 to capacitor 24, control circuit 10 provides reset signal R to close transistor switch 34 and discharge capacitor 18 through resistor 32. During the discharge cycle, switches 12 and 20 are in the open condition. Thus, capacitor 18 is discharged and ready to begin another memory sweep, or charging cycle, upon control system 10 presenting another input-related time signal T to transistor switch 12.

Referring now to FIG. 2, there is more particularly shown a circuit schematic for implementing the antilog system discussed hereinabove. Analog amplifiers U2A, U2B, clock U11, AND gate U6, and NOR gate U5 with associated resistors and capacitors generally form the control elements hereinabove discussed. Capacitor C7 and resistor R11 form the exponential charging circuit charging toward the reference voltage generated by operational amplifier U10. Transistor U4A forms the charging switch. Capacitor C7 discharges through resistor R10 and transistor U4B. In a preferred embodiment, operational amplifier U3A follows the voltage across capacitor C7 without loading capacitor C7. Transistor U4C forms the transfer switch for capacitor C6 and operational amplifier U3B.

The operation of the circuit depicted in FIG. 2 is hereinbelow discussed with reference to the timing diagram depicted in FIG. 4. Thus, the relative timing of signals A–J at the locations shown in FIG. 2 is depicted in FIG. 4. Clock U11 is the primary control element. The input labeled CONTROL forms the input signal by setting the crossing voltage level of amplifier U2B which, in turn, determines the charging time for capacitor C7, as hereinafter described.

The charging of capacitor C7 is determined by transistor U4A. When transistor U4A is gated ON, capacitor C7 begins to charge toward the reference voltage output of amplifier U10. Signal H controls the gating of transistor U4A. Signal H, in turn, is determined by a first pulse train from clock U11 and a second pulse train produced by the output of amplifier U2B, which is interconnected to obtain a comparator circuit, producing an output signal G when input signal F exceeds the CONTROL input reference signal.

Thus, an initial condition is established with capacitor C7 discharged, signal E gating transistor U4B to OFF, signal D gating transistor U4C to OFF, and transistor U4A being held OFF by signal H due to the occurrence of a low level output, signal B.

A conversion cycle is initiated when the state of signal B goes high. Complimentary signal A goes low forming one input to AND gate U6. A high level signal B causes signal H to be pulled high through diode CR7, gating on transistor U4A to start capacitor C7 charging toward the reference voltage.

Clock output signal C goes to a high level at the same time as signal level B, producing a logical "0" output, signal E, from NOR gate U5. Signal E thus gates OFF transistors U4B and U4D. When transistor U4D is gated OFF, operational amplifier U2A is configured as an integrator through capacitor C5 and resistor R5. A constant voltage input is provided by voltage divider network R8 and R6 so that a linearly increasing output voltage, signal F, is produced by the integrator circuit. Thus, capacitor C7 is charging exponentially and capacitor C5 is charging linearly.

Linear output signal F is now applied to the comparator circuit containing amplifier U2B. When the increasing ramp output voltage, signal F, equilibrates with the control input signal, the output state of amplifier U2B changes, and signal G returns to a low level. The occurrence of a low output level, signal G, drags signal H to a low level through diode CR3, gating OFF charging transistor switch U4A.

Thus, the charging of capacitor C7 is interrupted at a time set by the CONTROL input signal. The voltage level at capacitor C7 appears as signal J at the output of non-inverting amplifier U3A. Amplifier U3A transfers the voltage across capacitor C7 without loading capacitor C7. Thus, the voltage output, signal J, is held until signal B changes to a low level and complimentary output, signal A, returns to a high level.

The duration of output pulse B is selected to enable capacitor C7 to charge to a preselected range of output voltages. A high level output signal C is obtained at the same time signal A switches to a high output and signal B switches to a low output. Thus, an output is now obtained from AND gate U6, signal D, switching ON transistor U4C to transfer output signal J to charge capacitor C6 which is then presented as the OUTPUT from non-inverting amplifier U3B.

The low value of resistor R9 produces a small charging time constant and capacitor C6 is fully charged well before signal C returns to a low output, switching off transistor U4C. The occurrence of this low output signal C provides two low inputs to NOR gate U5, thereby producing a high output level, signal E, which gates ON transistor U4B to discharge capacitor C7 through resistor R10. Resistor R10 is also selected to provide a small time constant for rapid discharge of capacitor C7. When clock output signal C from clock U11 now goes high, the system is reset and ready to begin another antilog conversion.

The antilog conversion, OUTPUT, will remain until the CONTROL input is again converted to a new antilog output. Thus, the system operates substantially as an analog read only memory where the memory contents are displayed in analog form by the exponentially changing voltage across capacitor C7 and the appropriate value is selected by the control voltage used as the crossover reference for comparator U2B. Table I, hereinbelow set forth, contains typical component values and component designations suitable for the system hereinabove described.

TABLE I

| | | | |
|---|---|---|---|
| R4 | 10M | V+ | 15v |
| R5 | 412 | C4 | .1 |
| R6 | 1K | C5 | 1 |
| R7 | 1K | C6 | 1 |
| R8 | 118K | C7 | 1 |
| R9 | 1K | C13 | .1 |
| R10 | 1K | C14 | .1 |
| R11 | 12.1K | C23 | .1 |
| R21 | 100K | C24 | 10 |
| R22 | 316K | U2 | CA 3240E |
| R36 | 442 | U3 | CA 3240E |
| CR8 | 1N942 | U10 | LM 358 |
| CR3,7 | 1N914 | U11 | CD 4047 |

R in ohms; C in microfarads

Figure 3:
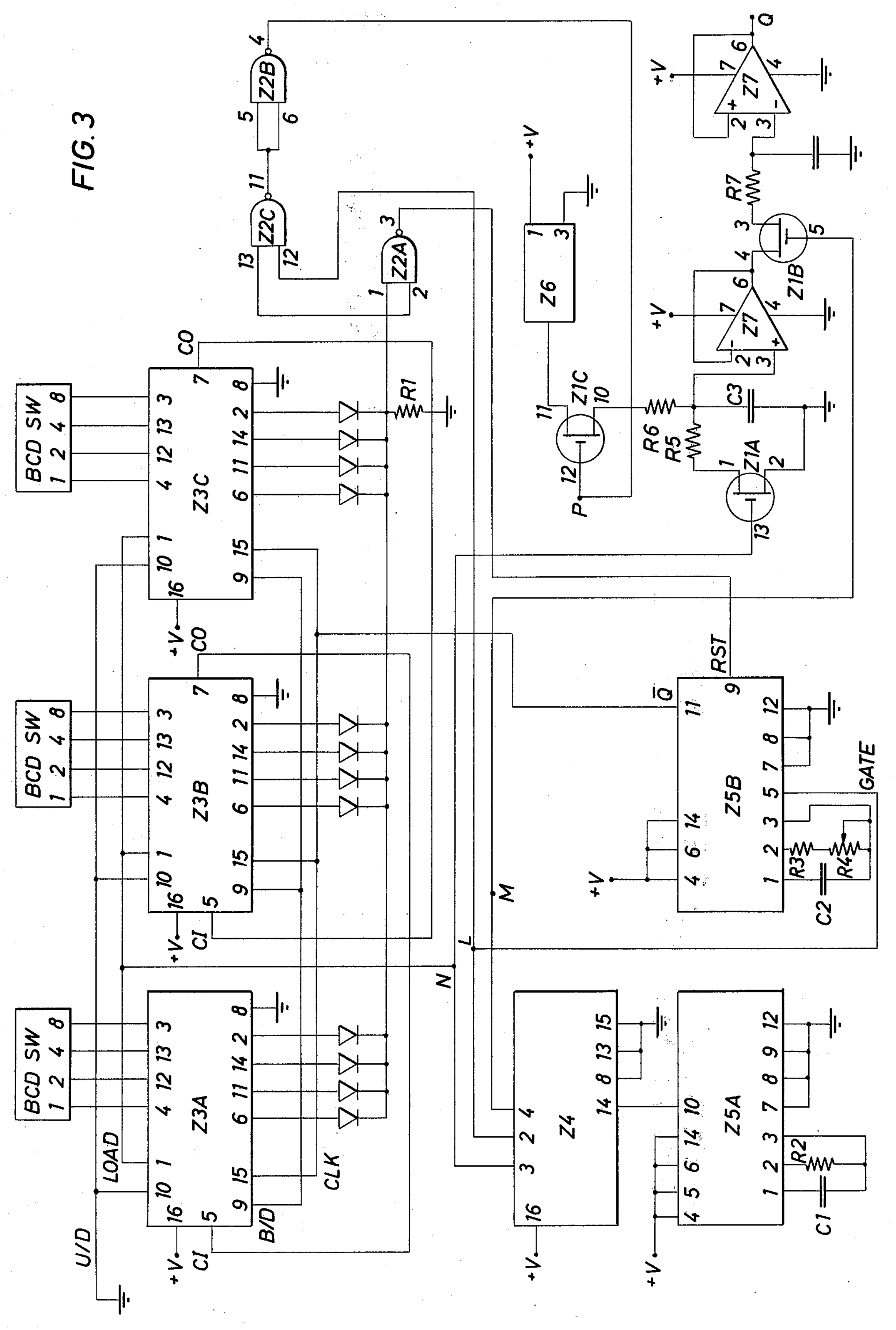
FIG. 3 is a detailed circuit schematic using digital input control.

Referring now to FIG. 3, there is depicted another schematic for an antilog conversion circuit using another control circuit. As shown in FIG. 3, a binary input is converted directly to an analog output functionally related to the antilog of the input.

As depicted in FIG. 3, the input is provided by binary coded decimal (BCD) switches. It is apparent that any suitable digital input could be provided where the inputs are provided to registers Z3A, Z3B, and Z3C. The system operating cycle is controlled by clock Z5A which provides an output pulse train to counter Z4. In one embodiment, the output pulses are provided at a relatively low rate, such as 20 Hz. Counter Z4 then provides output signals L, M, N to control system operation.

Clock Z5B is provided to produce the time related output equivalent to the linear ramp circuit hereinabove discussed.

Thus, in the initial condition, capacitor C3 is fully charged, and the output voltage has been transferred to output signal Q, as hereinafter described. Counter Z4 produces a first output signal N which acts to load the digital input into register Z3A, Z3B and Z3C whereby an output voltage is provided across resistor R1 corresponding to a high level at any of the register output ports.

Simultaneously, transistor switch Z1A is gated ON to discharge capacitor Z3 through resistor R5. Resistor R5 is selected to produce a relatively short time constant for capacitor C3 discharge in the time provided by output signal N. The system is now ready to convert the digital word at the output ports of registers Z3A, Z3B and Z3C to its antilog equivalent, output Q.

The voltage level across resistor R1 causes the output from NAND gate Z2A to switch to a low level, where it remains during the count-down. The voltage across R1 is also presented to NAND gate Z2C. Signal L is also applied to NAND gate Z2C and the occurrence of signal L concurrently with the voltage across R1 causes the output from NAND gate Z2C to switch to a low level. This low level output is applied to NAND gate C2B causing its output, signal P, to switch to a high output, gating ON transistor Z1C.

Signal L is also applied as the GATE signal to counter Z5B, producing an output pulse train $\overline{Q}$. The output pulse frequency $\overline{Q}$ is relatively fast, e.g., 100 KHz, as determined by capacitor C2, resistor R3 and trimming resistor R4.

Thus, output pulse train $\overline{Q}$ is applied as the clock, CLK, input to registers Z3A, Z3B and Z3C, to serially count down the digital numbers stored in registers Z3A, Z3B, and Z3C. It will be seen in FIG. 3 that the carry output CO register Z3C is connected to the carry input CI of register Z3B; the carry output CO of register Z3B is, in turn, connected to the carry input CI of register Z3A. Thus, at least one register output port is producing a high signal level across resistor R1 until a sufficient number of clock pulses, CLK, have been received to serially decrement registers Z3C, Z3B, and Z3A, i.e. the pulse input count equilibrates with the stored digital number.

When the last high bit level is decremented in register Z3A, the voltage across resistor R1 goes low. Throughout the above cycle, signal P has been at a high level and capacitor C3 has been charging toward reference voltage source Z6. When the voltage across resistor R1 goes to a low level, the output of NAND gate Z2A returns to a high level, the output of NAND gate Z2C goes to a high level, producing a low output level, signal P, from NAND gate Z2B. Thus, transistor Z1C is gated OFF and the voltage appearing across capacitor C3 is exponentially related to the charging time set by the binary coded input to the system. The voltage across capacitor C3 is presented at the output of operational amplifier Z7 for subsequent sampling.

The final control signal M is produced by counter Z4 and gates ON transistor Z1B to transfer the voltage across capacitor C3 to capacitor C4. Again, resistor R7 is selected to obtain a relatively short time constant to charge capacitor C4. The voltage on fully charged capacitor C4 is held as output signal Q by operational amplifier 27.

When the countdown cycle was completed, the voltage across resistor R1 switches to a low level, producing an output from NAND gates Z2A. This output signal is returned to clock Z5B as the reset RST signal to terminate output pulse train $\overline{Q}$ until the next conversion cycle. Output signals N, L, M, from counter Z4 are returned to low levels and the system is ready to initiate another conversion cycle.

Table II, hereinbelow presented, contains suitable values and component designations for the various elements comprising the circuit shown in FIG. 3.

TABLE II

| | | | |
|---|---|---|---|
| R1 | 100K | C1 | .01 |
| R2 | 100K | C2 | 1000 pf |
| R3 | 15K | C3 | .1 |
| R4 | 10K max. | C4 | 1 |
| R5 | 10K | Z1 | CD 4016 C |
| R6 | 90.2K | Z2 | CD 4011 C |
| R7 | 1K | Z3 | CD 4029 |
| Diodes | 1N914 | Z4 | CD 4047 |
| | | Z5 | CD 4047 |
| | | Z6 | LH 0070 |
| | | Z7 | CA 3130 |

R in ohms; C in microfarads

As depicted in FIG. 3, the first output $\overline{Q}$ from clock Z5B will occur one-half circle after signal L is received. Subsequent output pulses will then occur at full intervals. Thus, a small error is introduced which is significant only at small input values.

The above error can be eliminated by additional circuitry, not depicted in FIG. 3, to interrupt operation until the first output pulse $\overline{Q}$ is completed. A suitable circuit would intercept the first output pulse $\overline{Q}$ and simultaneously delay turning ON switch Z1C and thereafter initiate the count-down and charging cycle for succeeding full interval pulse outputs.

In one embodiment, a flip-flop may be disposed on the N signal line between clock Z4 and registers Z3A, Z3B, and Z3C. Thus, the load signal from Z4 resets the flip-flop so that the data is not loaded until the first output pulse $\overline{Q}$ from clock Z5B. The flip-flop also disenables gate Z2C, preventing the actuation of switch Z1A. Now the occurrence of the first output pulse $\overline{Q}$ acts to load the register input and initiate the charging cycle over the first full interval.

The above description has been described without reference to any particular numerical base for the antilogarithmic conversion. Of course, a given base is related to another base by a constant multiplier so circuit components are selected to yield the output converted to a preselected base. For example, the values of resistors R11 and R-5. Capacitors C7 and C5 shown in FIG. 2 are selected to yield a base 10 output. In FIG. 3, the clock Z5B frequency and the values of resistor R6 and capacitor C3 determine the output base and the frequency can be adjusted by trimmer R4.

It is apparent that the above-described invention is one well adapted to attain all of the features and advantages hereinabove set forth, together with other advantages which will become obvious and are inherent from a description of the preferred embodiments. It will be understood that certain combinations and sub-combinations are of utility and may be employed without reference to other features and sub-combinations. This is contemplated by and is within the scope of the present invention.

What is claimed is:

1. An analog read-only memory system for obtaining an antilog relationship between an input signal and an output signal, comprising:

analog means for providing an exponential-type memory signal varying as a function of time from a preselected initial voltage toward a preselected reference voltage, said analog means including a capacitor, a first resistor for charging said capacitor with a first time constant providing said exponential-type memory, and a second resistor for discharging said capacitor at a second time constant;

first switch means connecting said capacitor with said second resistor for initializing said analog means at said initial voltage;

second switch means for connecting said capacitor to said reference voltage through said first resistor at a first time and for disconnecting said capacitor from said reference voltage at a second time, the voltage on said capacitor forming said memory signal; and control means for generating a plurality of control signals, including signals for activating said second switch means at said first and second times, respectively, the difference between said first and second times being linearly related to said input signal.

2. Apparatus according to claim 1, further including:

a signal holding circuit for providing a stable output, and third switch means responsive to a control signal from said control means for transferring to said holding circuit said selected memory signal at a third time, where said third time is prior to initializing said analog means.

3. Apparatus according to claims 1, or 2, wherein said control means includes:

timing circuit means for providing a timing signal having linear characteristics, input means for generating an input signal compatible with said timing signal, and comparator means for comparing said input signal with said timing signal and producing said control signal at said second time when said timing signal equilibrates with said input signal.

4. Apparatus according to claim 3, wherein:

said timing circuit means includes a linear ramp voltage generator for comparing with said input signal, and said comparator means includes an operational amplifier configured to produce a signal level change forming said control signal when said ramp voltage crosses said input signal.

5. Apparatus according to claim 3, wherein:

said timing circuit means includes clock circuitry for producing periodic pulses, said input means includes digital register means for storing a digital number functionally related to said input, and said comparator means includes counting circuitry for producing said control signal when the number of said periodic pulses equilibrates with said stored digital number.

6. A method for generating an analog output signal functionally related to the antilog of an input signal, comprising the steps of:

deriving first and second control signals at a first time and a second time, respectively, the difference therebetween being linearly related to said input signal;

switching on a capacitor forming an analog read-only memory with said first signal into connection with a reference voltage through a first resistor to generate an exponentially increasing output signal beginning at a preselected initial voltage and increasing toward said reference voltage;

disconnecting said capacitor from said reference voltage with said second signal to select said exponentially increasing output signal at a level functionally related to said antilog of said input signal.

7. A method according to claim 6, further including:
transferring said output signal to an analog circuit for holding said output signal until a subsequent output signal is generated.

8. A method according to claim 7, further including:
returning said analog read-only memory to said preselected initial voltage after transferring said output signal.

9. A method according to claims 6, 7, or 8, wherein deriving said first and second control signals further comprises:
initiating said first control signal;
concurrently initiating a timing signal having linear characteristics;
generating a reference signal functionally related to said input signal;
comparing said timing signal with said reference signal; and
generating said second control signal when said timing signal equilibrates with said reference signal.

10. A method according to claim 9, wherein:
said timing signal includes a linearly changing voltage signal, and
generating said second control signal includes comparing said linearly changing voltage signal with said reference signal, and
producing said second control signal when said changing voltage signal crosses said reference signal level.

11. A method according to claim 9, wherein:
said timing signal includes a chain of periodic pulses,
generating said reference signal includes storing a digital number functionally related to said input signal, and
comparing said timing and said reference signals includes counting down said digital number with said periodic pulses until a selected digital number is obtained, and
producing said second control signal on the occurrence of said selected digital number.

* * * * *